United States Patent
Saito et al.

(10) Patent No.: US 10,709,028 B2
(45) Date of Patent: Jul. 7, 2020

(54) TOUCH PEN AND DISPLAY DEVICE USING TOUCH PEN

(71) Applicant: SHARP KABUSHIKI KAISHA, Sakai, Osaka (JP)

(72) Inventors: Hiroya Saito, Sakai (JP); Hirokazu Kawashima, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/116,741

(22) Filed: Aug. 29, 2018

(65) Prior Publication Data
US 2019/0174643 A1    Jun. 6, 2019

(30) Foreign Application Priority Data

Aug. 31, 2017    (JP) .................. 2017-167602

(51) Int. Cl.
| | | |
|---|---|---|
| H05K 5/02 | (2006.01) | |
| G06F 3/0354 | (2013.01) | |
| H05K 5/00 | (2006.01) | |
| G06F 3/041 | (2006.01) | |

(52) U.S. Cl.
CPC ....... *H05K 5/0217* (2013.01); *G06F 3/03545* (2013.01); *G06F 3/041* (2013.01); *G06F 3/0416* (2013.01); *H05K 5/0086* (2013.01); *H05K 5/0239* (2013.01)

(58) Field of Classification Search
CPC .. H05K 5/0217; H05K 5/0086; H05K 5/0239; G06F 3/041; G06F 3/03545; G06F 3/0416
See application file for complete search history.

(56) References Cited

U.S. PATENT DOCUMENTS

| | | | |
|---|---|---|---|
| 2011/0310066 A1* | 12/2011 | Fermgard | B43K 8/00 345/179 |
| 2012/0280949 A1* | 11/2012 | Huang | G02B 27/20 345/179 |
| 2017/0108955 A1* | 4/2017 | Mao | G06F 3/03545 |
| 2018/0011550 A1* | 1/2018 | Mihal | G06F 3/03545 |
| 2019/0155411 A1* | 5/2019 | Kinrot | G06F 3/0304 |

FOREIGN PATENT DOCUMENTS

| | | | |
|---|---|---|---|
| JP | 2003-150304 A | 5/2003 | |
| JP | 2013-250805 A | 12/2013 | |

\* cited by examiner

*Primary Examiner* — Alexander Eisen
*Assistant Examiner* — Kebede T Teshome
(74) *Attorney, Agent, or Firm* — ScienBiziP, P.C.

(57) ABSTRACT

A touch pen includes a shaft-shaped body, a pen tip provided on a front end of the body, a switch unit arranged in a line on a side face of the body, a battery disposed inside the body, and a barrel in which a slit having a front opening is formed in an axial direction. A back end of the body is inserted from the opening such that the barrel covers an outer face of the body with the switch unit positioned in the slit, and the barrel has a center of gravity on an opposite side of the slit as seen in a transverse cross-section. When the touch pen is placed horizontally in a state with the barrel mounted on the outer face of the body, the center of gravity is positioned on the opposite side of the switch unit and the switch unit is positioned on top.

6 Claims, 7 Drawing Sheets

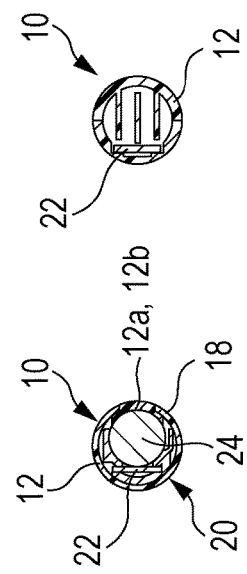
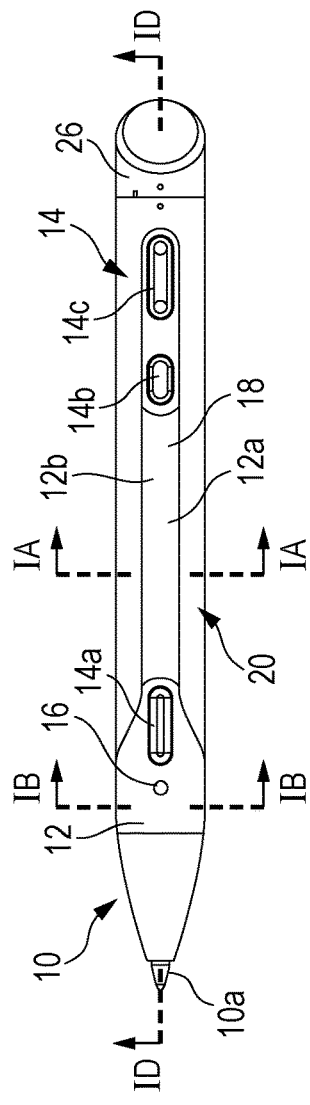
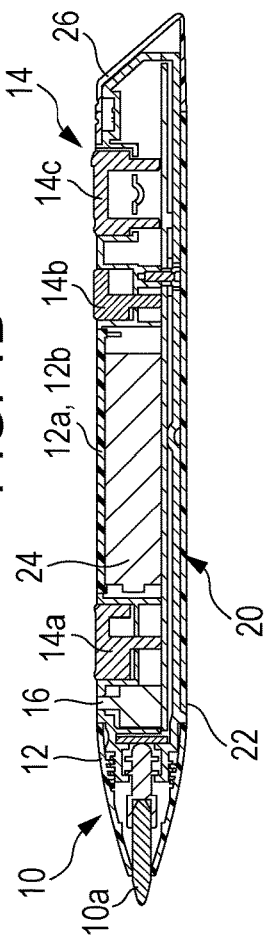
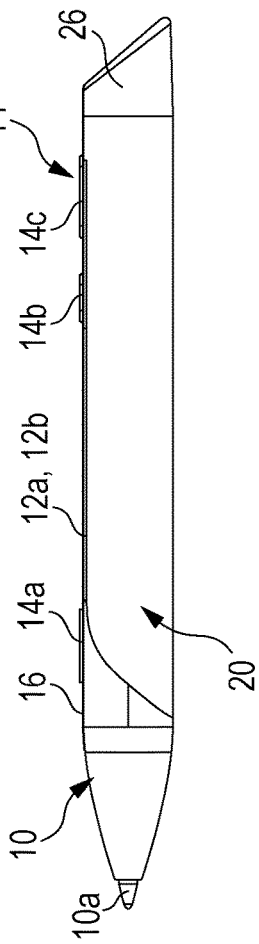

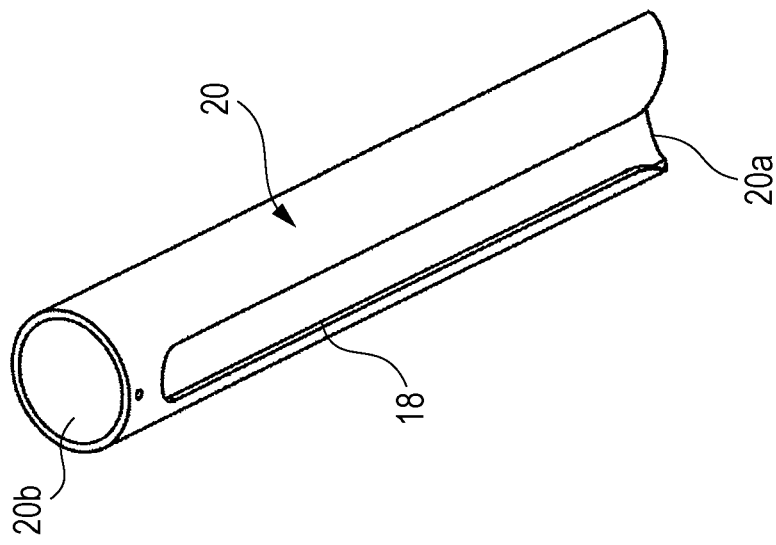
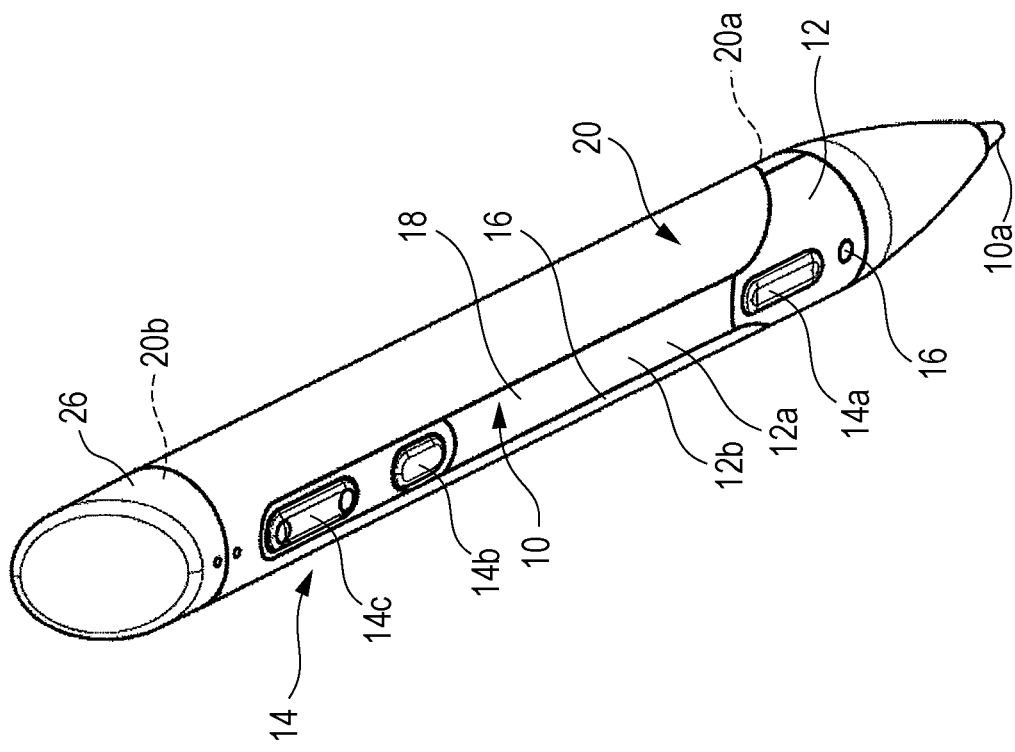

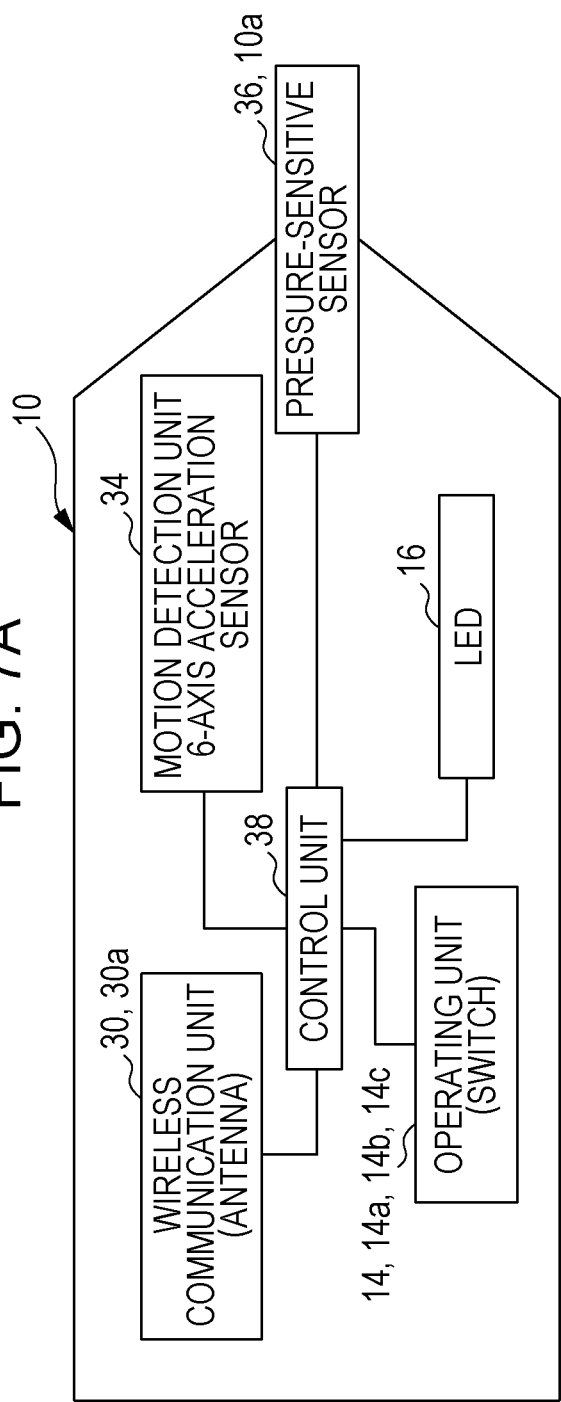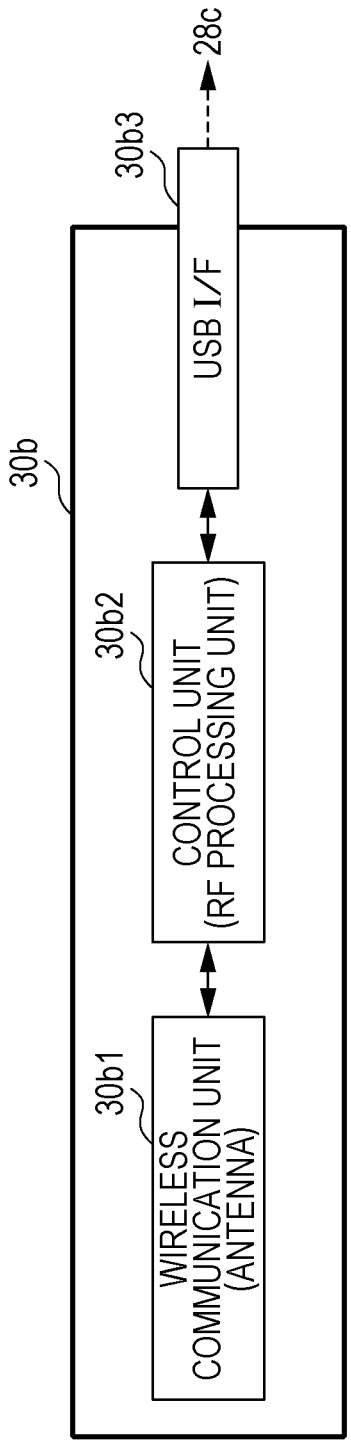

TOUCH PEN AND DISPLAY DEVICE USING TOUCH PEN

BACKGROUND

1. Field

The present disclosure relates to a touch pen that issues instructions to a display device such as a touch panel, and to a display device using the touch pen.

2. Description of the Related Art

In the related art, in an electronic touch pen that inputs information into a touch panel or the like in an electronic whiteboard system, a switch section and an indicator such as an LED are disposed on the body.

For example, Japanese Unexamined Patent Application Publication No. 2003-150304 discloses a pen input device provided with a depressing pen tip switch on a front end, a depressing button on a back end, and a liquid crystal display unit on a side face of the body of the input device.

Also, Japanese Unexamined Patent Application Publication No. 2013-250805 discloses a touch pen that includes a colorimetric sensor on a front end, and when a second function button arranged on a forward side face is operated to select a colorimetric mode, the colorimetric sensor executes a colorimetric process by an operation of a first function button.

In a touch pen of the related art, a switch unit for operation exists on the surface of a shaft-shaped body. Additionally, a battery for operation is built into the body of the pen, and the battery is replaced by removing a cover, but because of the relationship with a circuit board and the like, the installed position of the battery has a center of gravity that is eccentrically biased in one direction, such that in a case of the touch pen being placed on a table, there is a risk of the touch pen tilting towards the switch unit side and damaging the switches. Biasing the position of the battery in a desired position is difficult given the above arrangement of the circuit board and the like, and since using a weight makes complicates the structure, technology that effectively minimizes tilting of the touch pen with a simple structure has not been developed.

In light of such circumstances, it is desirable to provide a touch pen capable of imparting proper center-of-gravity balance and minimizing rolling with a simple structure, and a display device using the touch pen.

SUMMARY

According to an aspect of the disclosure, there is provided a touch pen of a pen-type electronic input device including a shaft-shaped body, a pen tip used to input information and provided on a front end of the body, a switch unit used to perform operations and arranged in a line on a side face of the body, a battery disposed inside the body, and a barrel in which a slit having a front opening is formed in an axial direction. A back end of the body is inserted from the front opening of the barrel such that the barrel covers an outer face of the body with the switch unit positioned in the slit, and the barrel has a center of gravity on an opposite side of the slit as seen in a transverse cross-section. In a case of the touch pen being placed horizontally in a state in which the barrel is mounted on the outer face of the body, the center of gravity is positioned on the opposite side of the switch unit and the switch unit is positioned on top.

According to another aspect of the disclosure, there is provided a display device including a touch panel that receives handwriting input, a display unit that displays a trail of handwriting received by the touch panel, and an operating member that performs an input operation with respect to the touch panel, in which the touch pen according to the aspect of the disclosure is used as the operating member.

BRIEF DESCRIPTION OF THE DRAWINGS

FIGS. 1A to 1E are explanatory diagrams of the touch pen according to an embodiment of the present disclosure, in which FIG. 1A is a cross-section diagram along the IA-IA line in FIG. 1C, FIG. 1B is a cross-section diagram along the IB-IB line in FIG. 1C, FIG. 1C is an overall front view, FIG. 1D is a cross-section diagram along the ID-ID line in FIG. 1C, and FIG. 1E is an overall side view;

FIGS. 2A and 2B are explanatory diagrams of the touch pen in FIGS. 1A to 1E, in which FIG. 2A is an overall perspective view from behind, and FIG. 2B is an overall perspective view from behind of a barrel;

FIGS. 3A to 3E are explanatory diagrams of the barrel provided in the touch pen of FIGS. 1A to 1E, in which FIG. 3A is a side view of FIG. 3C, FIG. 3B is a cross-section diagram along the IIIB-IIIB line in FIG. 3D, FIG. 3C is a view from behind, FIG. 3D is a front view, and FIG. 3E is a view from the front;

FIGS. 4A and 4B are explanatory cross-section diagrams of the touch pen of FIGS. 1A to 1E, in which FIG. 4A is a cross-section diagram along the IA-IA line in FIG. 1C, and FIG. 4B is a cross-section diagram along the IB-IB line in FIG. 1C;

FIGS. 7A and 7B are explanatory diagrams of the touch pen and the dongle in the system of FIG. 5.

DESCRIPTION OF THE EMBODIMENTS

Figure 3C:
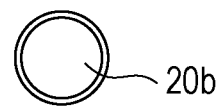
Figure 3A:
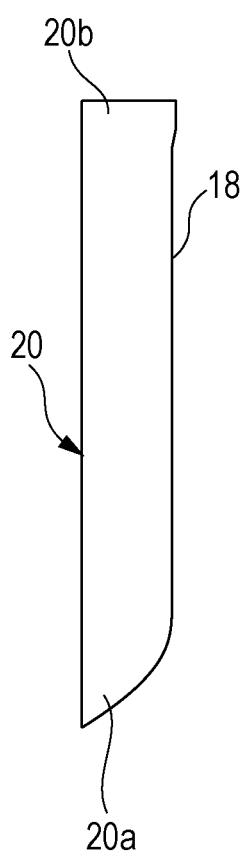
Figure 3B:
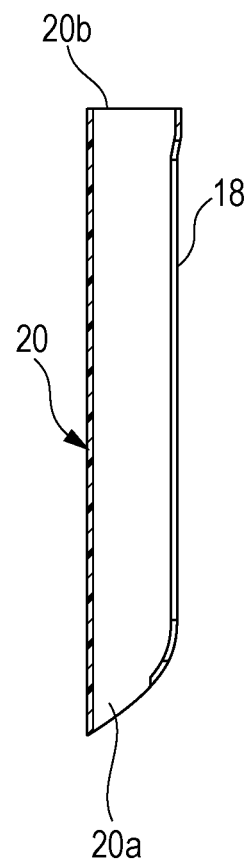
Figure 3D:
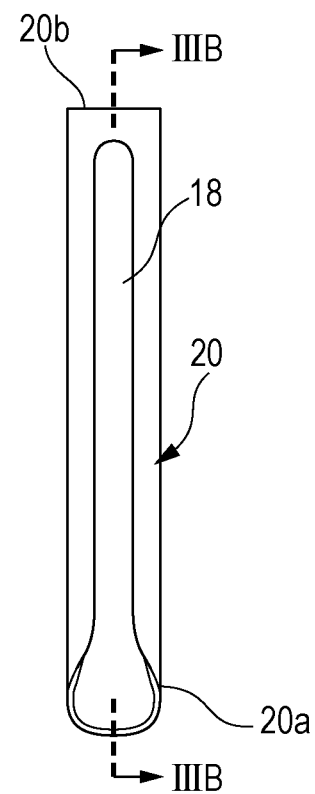
Figure 3E:
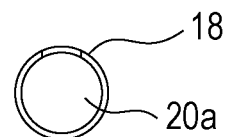
Figure 4A:
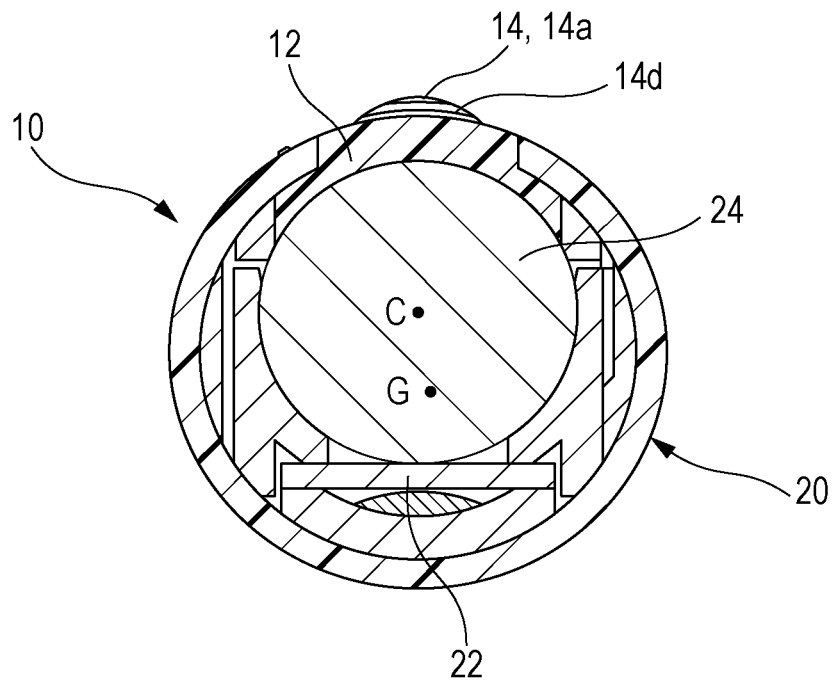
Figure 4B:
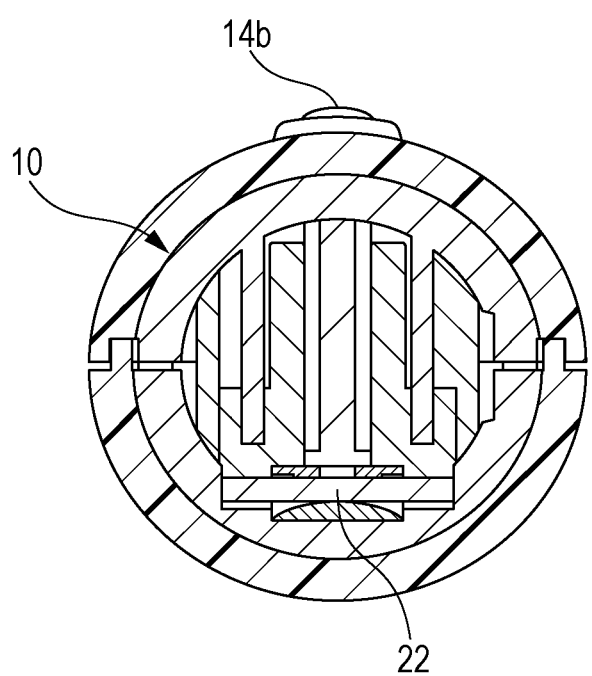

Hereinafter, an embodiment of the present disclosure will be described with reference to the attached drawings. FIGS. 1A to 1E, and also FIGS. 2A and 2B, are explanatory diagrams of the touch pen, FIGS. 3A to 3E are explanatory diagrams of the barrel, while FIGS. 4A and 4B are explanatory cross-section diagrams of the touch pen.

As illustrated in FIGS. 1A to 1E, and also FIGS. 3A to 3E, the touch pen 10 according to the present embodiment relates to the touch pen 10 of a pen-type electronic input device provided with a pen tip 10a for information input on the front end of a shaft-shaped body 12, in which a switch unit 14 (14a, 14b, and 14c) for operation and an indicator unit 16 for display are provided on the body 12.

The touch pen 10 includes the switch unit 14 and the indicator unit 16 arranged in a line provided on a side face unit 12a of the body 12, a battery 24 disposed inside the body 12, and an electrically conductive barrel 20 in which a slit 18 is formed in the axial direction, a back end of the body 12 is inserted from a front opening of the barrel 20 such that the barrel 20 covers an outer face of the body 12 with the switch unit 14 and the indicator unit 16 positioned in the slit 18, and the barrel 20 has a center of gravity on an opposite side of the slit 18 as seen in a transverse cross-section, wherein in a case of the touch pen 10 being placed horizontally in a state in which the barrel 20 is mounted on the outer face of the body 12, the center of gravity is positioned on the opposite side of the switch unit 14 and the switch unit 14 is positioned on top.

The battery 24 is provided inside the housing of the body 12 in a central part in the axial direction of the body 12, structured such that in the housing 12, a battery lid unit 12b may be removed from the barrel 20 to allow the battery 24 to be inserted or removed from the body 12.

Also, in the barrel 20, a diagonal front opening is formed in the front end part 20a, in which a back end part of the body 12 is inserted from the diagonal opening such that the outer face of the body 12 is covered by the barrel 20. Because the front end part 20a has a diagonal opening, the diagonal portion acts as a guide when inserting the back end part of the body 12, making it easy to push in the body 12 and mount the barrel 20 onto the body 12.

Also, a conducting unit 22 of a lead on a control board or the like that conducts electricity from the pen tip 10a to the barrel 20 is provided inside the body 12, and in the case in which the touch pen 10 is used with a capacitive touch panel, the electrostatic capacitance of the pen tip 10a can be secured by having the user hold the barrel.

As illustrated in FIGS. 1A to 1E, the touch pen 10 is provided with a battery 24 inside the housing of the body 12, in a central part in the axial direction of the body 12. The housing of the body 12 is formed by thin resin sheet, and a lid unit 12b of the side face unit 12a is openably provided, making it possible to open the lid unit 12b to remove or replace the battery 24.

Also, on the back end part of the touch pen 10, a cap 26 for affixing the barrel 20 mounted onto the body 12 is removably fitted. In other words, the cap 26 is removably provided on the back end part of the body 12 of the touch pen 10, such that when the barrel 20 covers the body 12, the barrel 20 is affixed to the body 12 by the affixing of the cap 26 to the body 12, and by removing the cap 26, the barrel 20 becomes removable from the body 12. The cap 26 is shaped such that the back end is cut diagonally. From the shape of the cap 26, it is easy to see and recognize which direction the back of the touch pen 10 is facing.

As illustrated in FIGS. 2A and 2B, and also FIGS. 3A to 3E, the barrel 20 is a hollow pipe made of a conductive metal such as aluminum or copper, and is open from a front end part 20a to a back end part 20b. Additionally, the approximately U-shaped slit 18 which opens towards the front is formed by being cut out of a side face part of the barrel 20. Specifically, an opening is cut diagonally at the front end part 20a with the opening connected to the slit 18, and in addition, the back end part 20b is formed in a cylindrical shape with the slit 18 formed extending up to the vicinity of the back end part 20b.

The merits of the metal tube construction of the barrel 20 with the slit 18 are that the switch unit 14 and the indicator unit 16 are arranged in a straight line, and are easy to see during use.

In addition, by arranging the switch unit 14 and the indicator unit 16 in a line on the operating face, and using the slit 18 to keep the barrel 20 from interfering with the line, the layered structured of the touch pen 10 as a whole is reduced, which keeps the diameter from increasing.

Also, by establishing electric conduction from the pen tip 10a to the barrel 20 internally and holding the barrel 20 in hand, it is possible to secure the electrostatic capacitance of the pen tip during use with a capacitive touch panel.

Since metal is used for the barrel 20, strength is secured. With this arrangement, it is possible to achieve a structure with a large slit 18, while in addition, it is also possible to reduce the thickness itself as a cover. Also, the barrel 20 has a slit formed in the axial direction, and a center of gravity on the opposite side of the slit as seen in a transverse cross-section. Since the slit 18 is formed to bias the center of gravity, the center of gravity becomes located eccentrically on the opposite side of the slit.

Since the barrel 20 is completely removable from the body 12 by removing the cap 26, the cover is mostly removable, thereby allowing the battery 24 to be disposed near the middle of the housing, or in other words, in the central part in the lengthwise direction of the body 12. With this arrangement, the center of gravity may be shifted farther forward compared to the case of inserting the battery 24 in the band end part of the body 12, making the pen easy to hold.

Also, the front end of the barrel 20 is cut diagonally, which in addition to imparting design, accepts the housing of the touch pen and makes assembly easier when the body 12 is inserted from the back.

According to the touch pen 10 of the embodiment, since the switch unit 14 (14a, 14b, and 14c) arranged in a line on the side face unit 12a of the cylindrical body 12, and the conductive metal barrel 20 having the slit 18 formed in the axial direction are included, such that the switch unit 14 passes through the slit 18 to be mounted on the outer face of the shaft-shaped body 12 in an exposed state, it is possible to maintain strength with the barrel 20, while in addition, the switch unit 14 to operate is arranged in a straight line, and is thus easy to see and easy to use during usage. In addition, the indicator unit 16 for display is also arranged in the same straight line as the switch unit 14, and is thus easy to see and easy to use.

Also, by having the switch unit 14 to operate and the indicator unit 16 pass through the slit 18 in an exposed state and not interfere, it is possible to reduce the layered structured of the touch pen 10, and keep the diameter from increasing. Consequently, in the touch pen 10, effects such as the switch unit 14 being easy to use while also ensuring strength even with a narrow diameter may be exhibited.

Another structure will be described. The arrangement of the switch unit 14 (14a, 14b, and 14c) is divided between when the pen is held in a normal grip and when the pen is held in a reverse grip.

The switch unit 14a on the front side is easy to press when the pen is held in an ordinary grip, and thus is used in conjunction with a note-taking application or the like. The switch units 14b and 14c on the back side are used for presentations, in which the switch unit 14b may be operated to control a pointer, and the switch unit 14c is a swing switch used for page up/down by default.

The pointer is used in a grip with the back end of the touch pen 10 pointing forward, but by making the shape of the back end of the touch pen 10 not simply flat, but a shape that is cut diagonally, the back end takes a shape that is reminiscent of the direction of the pointer when used.

Herein, the center of gravity of the touch pen 10 will be described. Regarding the touch pen 10, FIG. 4A is a cross-section diagram along the IA-IA line in FIG. 1C, and FIG. 4B illustrates a cross-section along the IB-IB line in FIG. 1C. As illustrated in FIGS. 4A and 4B, the touch pen 10 is in a state in which the battery 24 occupies most of the space inside the body 12, in which the center of gravity of the battery 24 is moved upward to the extent of the operating portion, such that from the shape of the body 12 alone of the touch pen 10, the pen would roll easily when placed on a table.

In the state in which the pen stops with the switch unit 14 for operation and the indicator unit 16 for display facing the table surface, there is a possibility of external pressure being imposed and causing damage, and for this reason a seat part 14d of the operating unit protects the buttons. Note that with regard to the center of gravity, since the battery 24 exists in the approximate center (of the body 12), the pen is unlikely to rotate unless rolled intentionally.

In the embodiment, the barrel 20 acts as a pen cover mounted onto the body 12. As illustrated in FIGS. 2A and 2B, and also FIGS. 3A to 3E, the barrel 20 has a metal pipe shape in which a portion thereof has been cut away to form the slit 18 in the lengthwise direction. As illustrated in FIGS. 1A to 1E and FIGS. 4A and 4B, if the barrel 20 is press-fitted onto the body 12 along the slit 18, the barrel 20 covers and protects the body 12.

By attaching the barrel 20, the weight of the barrel 20 causes the center of gravity of the touch pen 10 to become positioned at the sign G below (the opposite direction of the switch unit 14 and the indicator unit 16) the center point C. In the embodiment, the outer circumferential face of the body 12 is formed thinly in the portion on which the barrel 20 is mounted, such that when the barrel is mounted onto the body 12, the outer diameters are unified in a circular cross-section. In this case, the outer diameters are aligned, with the area around the switch unit 14 and the indicator unit 16 projecting outward. Consequently, when the touch pen 10 is not in use, even if the touch pen 10 is placed on a table rocking back and forth, the touch pen 10 will immediately stabilize with the switch unit 14 and the indicator unit 16 facing upward. Additionally, in the touch pen 10, since the battery 24 is disposed inside the body 12, and since the barrel 20 having the slit 18 formed in the axial direction and having a center of gravity on the opposite side of the slit as seen in a transverse cross-section is provided, when the touch pen 10 is placed horizontally in a state with the barrel 20 mounted on the outer face of the shaft-shaped body 12, the center of gravity is positioned on the opposite side of the switch unit 14 with the switch unit 14 positioned on top. For this reason, when the touch pen 10 is placed on a horizontal surface such as a tabletop when not in use, the touch pen does not rotate or roll, and the switch unit 14 does not hit the horizontal surface, and the switch unit 14 is not damaged. Also, the structure for imparting center-of-gravity balance of the barrel 20 is simple. Therefore, proper center-of-gravity balance is imparted and rolling is minimized with a simple structure.

Figure 5:
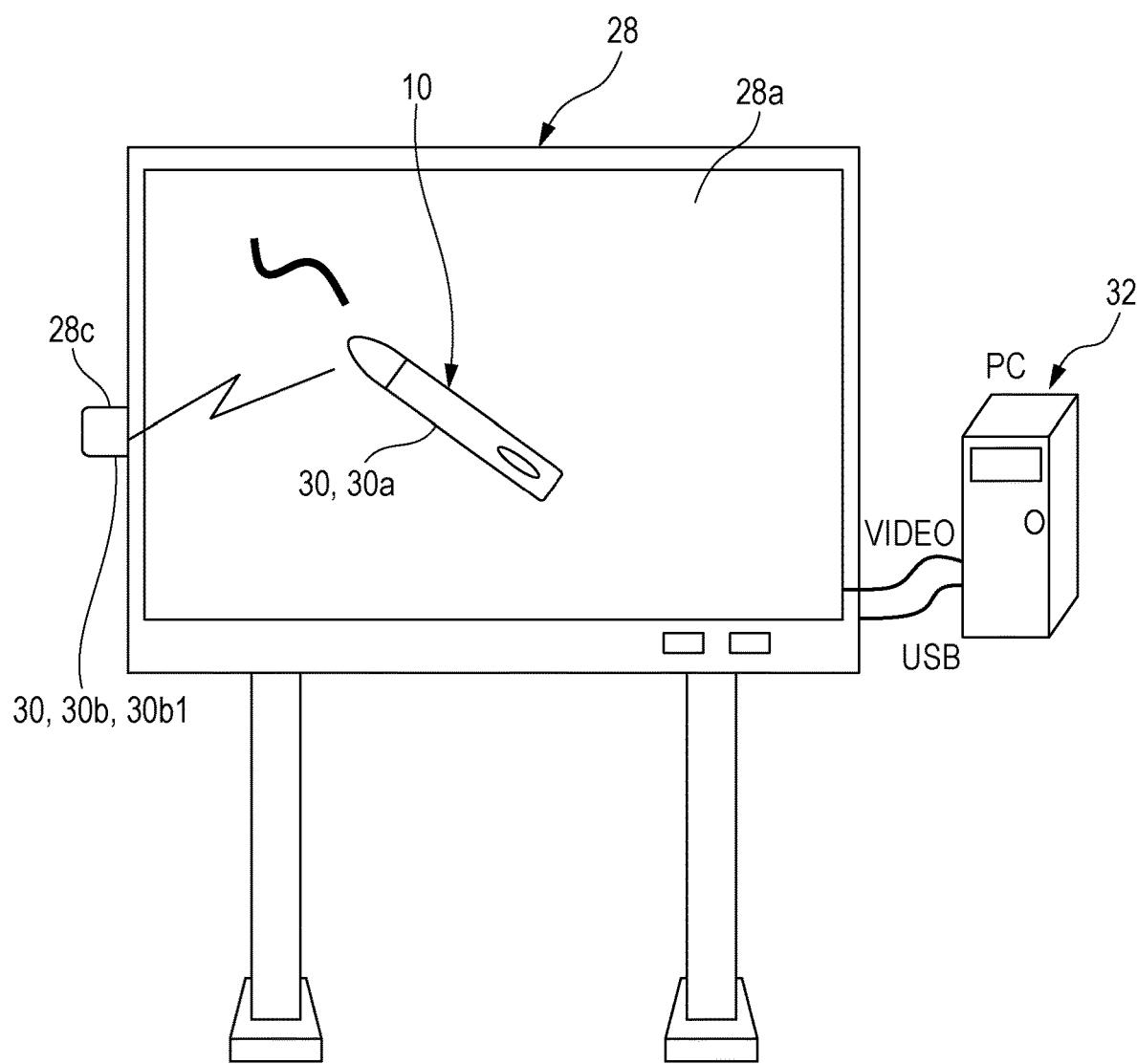
FIG. 5 is a configuration diagram of a system in which the touch pen is used with an electronic whiteboard.
Figure 6:
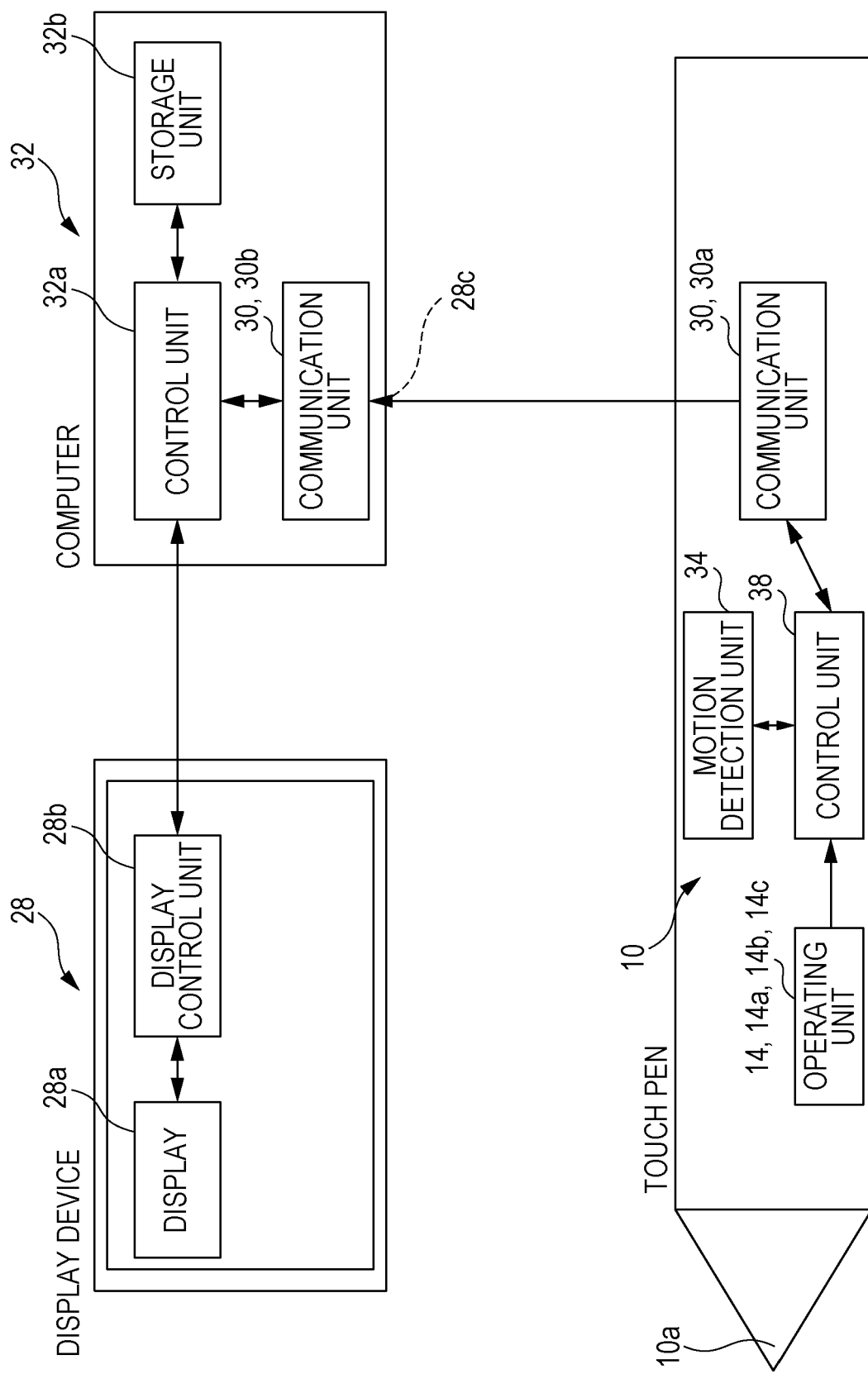
FIG. 6 is a system block diagram of FIG. 5.

Herein, a display device that uses the touch pen 10 will be described. FIG. 5 is a configuration diagram of a system in which the touch pen according to the embodiment is used with the display device of an electronic whiteboard, while FIG. 6 is a block diagram of the system, and FIGS. 7A and 7B are explanatory diagrams of the touch pen and a dongle in the system. The display device 28 is a display device provided with a display 28a that acts as a touch panel which receives handwriting input, the display 28a that acts as a display unit which displays the trail of handwriting received by the display 28a, and an operating member that performs input operations with respect to the touch panel. The display device 28 is a system related to an electronic whiteboard using the touch pen 10 as the operating member.

As illustrated in FIGS. 5 and 6, by causing the touch pen 10 to touch the surface of the display 28a of the display device 28, a signal is input from a communication unit 30 to a computer 32, thereby causing calculation results such as numerical values, text, graphics, and images to be displayed on the display screen of the display device 28.

For example, in the electronic whiteboard system, as illustrated in FIGS. 6 and 7A, the touch pen 10 is provided with the switch unit 14 as an operating unit, a display unit such as the indicator unit 16, a motion detection unit 34 that detects the motion of the touch pen 10 with a 6-axis acceleration/angular velocity sensor, a pressure-sensitive sensor 36 that detects the pressure when touching with the pen tip 10a, a control unit 38 that controls the input and output of these signals, and an antenna 30a of the communication unit 30 for inputting and outputting signals with respect to external equipment. The display device 28 includes a display control unit 28b that controls images and characters to display on the display 28a. Also, the computer 32 is provided with a communication unit of a dongle 30b connected via USB, a control unit 32a, and a storage unit 32b.

The communication unit 30 adopts the Bluetooth (registered trademark) wireless communication method, for example. The display device 28 is provided with a USB port 28c that delivers signals to the computer 32, and by connecting the dongle 30b for signal transmission and reception to the USB port 28c, the communication unit 30 exchanges signals in a wireless manner through the dongle 30b. The dongle 30b is provided with a wireless communication unit 30b1 of an antenna, a control unit 30b2 for RF connection, and a USB interface (I/F) 30b3.

When using the touch pen 10, calculations are performed by the computer 32 via the dongle 30b by known methods, and displayed on the display 28a of the display device 28. When the touch pen 10 is not in use, such as when the touch pen is placed on a table, the pen does not roll and is convenient, as described above.

Note that the present disclosure is not limited to the embodiment. The structure and the like of the touch pen may be modified in various ways while remaining within the scope of the present disclosure. For example, the types or the like of the switch unit may also be seesaw switches or slide switches. The indicator unit may be disposed anywhere that is easy to see.

The touch pen of the present disclosure may be utilized as any of various types of touch pens, such as capacitive, pressure-sensitive, or optical.

The present disclosure contains subject matter related to that disclosed in Japanese Priority Patent Application JP 2017-167602 filed in the Japan Patent Office on Aug. 31, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A touch pen of a pen-type electronic input device comprising:
   a cylindrical-shaft-shaped body;
   a pen tip used to input information and provided on a front end of the body;
   a switch used to perform operations and arranged in a line on a side face of the body;
   a battery disposed inside the body; and
   a cylindrical-tube-shaped barrel in which a slit having a front opening is formed in an axial direction,
   a battery lid of the side face of a housing of the body, wherein
   an outer face of the body comprises a cylindrical outer surface,
   an inner face of the barrel comprises a cylindrical inner surface, a back end of the body is inserted from the front opening of the barrel such that the cylindrical inner surface of the inner face of the barrel contacts and covers the cylindrical outer surface of the outer face of the body with the switch positioned in the slit, and the barrel has a center of gravity on an opposite side of the slit as seen in a transverse cross-section, in a case of the touch pen being placed horizontally in a state in which the barrel is mounted on the outer face of the body, the center of gravity is positioned on the opposite side of the switch and the switch is positioned on top, and the battery is provided inside the housing of the body in a central part in an axial direction of the body, structured such that in the housing, the battery lid is removable from the side face of the barrel to allow the battery to be inserted or removed under the condition that the barrel is removed from the body.

2. The touch pen according to claim 1, wherein in the barrel, a diagonal front opening is formed in a front end part, in which a back end part of the body is inserted from the diagonal opening such that the outer face of the body is covered by the barrel.

3. The touch pen according to claim 1, further comprising:

a cap removably provided on the back end of the body, wherein in a case of the barrel covering the body, the barrel is affixed to the body by the affixing of the cap to the body, and by removing the cap, the barrel becomes removable from the body.

4. A display device comprising:

a touch panel that receives handwriting input;

a display unit that displays a trail of handwriting received by the touch panel; and an operating member that performs an input operation with respect to the touch panel, wherein the touch pen according to claim 1 is used as the operating member.

5. The touch pen according to claim 1, wherein the barrel covers part of a surface of the battery lid under the condition that the barrel is mounted on the body.

6. The touch pen according to claim 1, wherein the switch comprising of a first switch on front side and a second switch on rear side in the line on a side face of the body; and a lid is placed between the first switch and the second switch.

* * * * *